United States Patent
Hashimoto et al.

(10) Patent No.: US 8,106,726 B2
(45) Date of Patent: Jan. 31, 2012

(54) ELASTIC SURFACE WAVE DEVICE COMPRISING DUMMY ELECTRODES

(75) Inventors: Kenya Hashimoto, Chiba (JP); Masatsune Yamaguchi, Chiba (JP); Tatsuya Omori, Chiba (JP); Naofumi Yokoyama, Chiba (JP); Kenji Matsuda, Chiba (JP)

(73) Assignee: National University Corporation Chiba University (JP)

( * ) Notice: Subject to any disclaimer, the term of this patent is extended or adjusted under 35 U.S.C. 154(b) by 557 days.

(21) Appl. No.: 11/814,368

(22) PCT Filed: Jan. 17, 2006

(86) PCT No.: PCT/JP2006/300916
§ 371 (c)(1),
(2), (4) Date: Feb. 24, 2009

(87) PCT Pub. No.: WO2006/078001
PCT Pub. Date: Jul. 27, 2006

(65) Prior Publication Data
US 2009/0206954 A1    Aug. 20, 2009

(30) Foreign Application Priority Data

Jan. 21, 2005  (JP) ................ 2005-014905

(51) Int. Cl.
*H03H 9/145* (2006.01)
*H03H 9/25* (2006.01)
*H03H 9/64* (2006.01)

(52) U.S. Cl. ..... 333/195; 333/194; 333/196; 310/313 B; 310/313 D

(58) Field of Classification Search .......... 333/193–196; 310/313 B, 313 C, 313 D
See application file for complete search history.

(56) References Cited

U.S. PATENT DOCUMENTS

| | | | |
|---|---|---|---|
| 4,205,285 A * | 5/1980 | Dempsey et al. | 333/194 |
| 4,472,694 A * | 9/1984 | Lee | 333/194 |
| 4,866,325 A | 9/1989 | Kodama et al. | |
| 6,025,763 A | 2/2000 | Morimoto | |
| 6,522,219 B2 * | 2/2003 | Takamiya et al. | 333/133 |
| 6,946,931 B2 * | 9/2005 | Inoue et al. | 333/195 |
| 7,453,334 B1 * | 11/2008 | Abbott et al. | 333/195 |
| 2005/0110367 A1 * | 5/2005 | Kondratiev | 310/313 B |

FOREIGN PATENT DOCUMENTS

| | | |
|---|---|---|
| EP | 0 795 958 A2 | 9/1997 |
| EP | 1 324 489 A1 * | 7/2003 |
| JP | 3-158014 * | 7/1991 |
| JP | 7-28195 B2 | 3/1995 |
| JP | 9-246913 | 9/1997 |
| JP | 11-191720 | 7/1999 |
| JP | 3119579 | 10/2000 |
| JP | 2001-127580 | 5/2001 |
| JP | 2003-218665 * | 7/2003 |

OTHER PUBLICATIONS

English language machine translation of JP 2003-218665, published Jul. 31, 2003.*

* cited by examiner

*Primary Examiner* — Barbara Summons
(74) *Attorney, Agent, or Firm* — Knobbe, Martens, Olson & Bear, LLP

(57) ABSTRACT

A surface acoustic wave device includes a pair of reflectors and an interdigital transducer having a cross electrode having a interdigitated portion and a dummy portion and a dummy electrode. The dummy electrode has a length different from the length of the dummy portion of the cross electrode arranged adjacent to the dummy electrode.

14 Claims, 18 Drawing Sheets

ELASTIC SURFACE WAVE DEVICE COMPRISING DUMMY ELECTRODES

RELATED APPLICATIONS

The present application is the U.S. national phase application under 35 U.S.C. §371 of PCT/JP2006/300916, filed Jan. 17, 2006, which claims priority to Japanese Application No. 2005-014905, filed Jan. 21, 2005, the entireties of both of which are incorporated herein by reference.

TECHNICAL FIELD

The present invention relates to a surface acoustic wave device.

BACKGROUND ART

A current communication system presupposes use of a highly selective filter to realize high reliability and high-speed information transmission with limited frequency resources. Many surface acoustic wave devices are currently being used for such applications and it is no exaggeration to say that a surface acoustic wave device is now an indispensable component which controls the efficiency of communication equipment.

The achievable performance of a surface acoustic wave device is limited by a piezoelectric substrate used, and therefore a material having large piezoelectricity and satisfactory temperature stability is required. On the other hand, since the surface acoustic wave device is used as a filter, unwanted responses which occur from various causes obstruct characteristics thereof. Therefore, a substrate material or a design technique avoiding any unwanted responses has been searched for.

FIG. 17 shows the structure of an elastic surface resonator 131 which is a typical surface acoustic wave device. The elastic surface resonator shown in FIG. 17 has a pair of reflectors 132 and an interdigital transducer (IDT) 133 arranged between this pair of reflectors and a surface acoustic wave (hereinafter also simply referred to as "SAW") excited by the IDT is reflected at a specific frequency between the pair of reflectors and a resonant wave is thereby produced. The IDT 133 generally has a cross electrode 1332 and a dummy electrode 1333 and further a pair of common electrodes 1331 commonly connected to these electrodes.

One of unwanted responses of this element is a so-called "transverse mode" produced as an SAW propagates in a zig-zag through the interdigital transducer or the reflector in an upward or downward diagonal direction (direction which is different from the direction in which the resonant wave is traveling).

Against this unwanted response, there is a technique of selecting, for example, a small $W_G$ and Wa in FIG. 17 to thereby confine the SAW within a narrow range in vertical direction in the figure (directions perpendicular to the direction in which the resonant wave is traveling) and limiting the number of transverse modes generated (first technique).

In addition, there is also a technique of assigning weights to the lengths of interdigitated portions of a cross electrode section of an IDT 143 as shown in FIG. 18 (see broken lines in FIG. 18) to make any mode other than a specific transverse mode less prone to being manifested (second technique).

However, in the case of the technique in FIG. 17 above, since $W_G$ and Wa are small, capacitance diminishes accordingly resulting in a problem that it is difficult to realize a low-loss surface acoustic wave device.

Furthermore, in the case of the technique in FIG. 18, a specific transverse mode can be controlled, yet it is difficult to suppress unwanted responses caused by other transverse modes.

Therefore, in view of the above described problems, it is an object of the present invention to efficiently suppress unwanted responses and provide a low-loss surface acoustic wave device.

DISCLOSURE OF THE INVENTION

In order to attain the above described object, the present invention adopts the following specific means.

A first means is a surface acoustic wave device including a pair of reflectors and an interdigital transducer arranged between this pair of reflectors, which has a cross electrode having a interdigitated portion and a dummy portion, and a dummy electrode, wherein the dummy electrode has a length different from a length of the dummy portion of the cross electrode adjacent to this dummy electrode.

This causes an SAW in a transverse mode whose energy has exuded even to the dummy electrode and the dummy portion of the cross electrode to scatter due to non-uniformity of the dummy electrode or the dummy portion of the cross electrode and allows unwanted responses to be effectively controlled. Furthermore, it is not necessary to decrease or change the length of the interdigitated portion and it is possible to realize a low-loss surface acoustic wave device without causing substantially any influence on a principal mode in which energy is concentrated on the interdigitated portion of the cross electrode.

According to this means, the length of the dummy electrode and the length of the dummy portion of the cross electrode are preferably weighted along the traveling direction of the resonant wave or the length of the dummy electrode and the length of the dummy portion of the cross electrode also preferably vary along the traveling direction of the resonant wave like a triangular, rectangular or trigonometric function or randomly.

Here, as will be explained in detail in later embodiments, the "traveling direction of the resonant wave" is the traveling direction of a resonant wave generated by a pair of reflectors and more specifically refers to the direction perpendicular to the direction of a linear electrode in the reflector. The terms "traveling direction of the resonant wave", "vertical" and "parallel" or the like involve errors in the fabrication and there is also a tradeoff with the accuracy of the device, but these errors are generally tolerable several degrees.

In addition, "weighted along the traveling direction of the resonant wave" means that when variations in target physical quantities (length, width or thickness) (of the dummy electrode section or the dummy portion of the cross electrode) are measured in the order along the traveling direction of the resonant wave, variations are given significantly. The amount of this weighting can be designed as appropriate as far as unwanted responses can be reduced, and when, for example, the physical quantity is a length, the difference between a maximum length and a minimum length is preferably greater than one wavelength of the resonant wave from the standpoint of efficient scattering of the SAW in the transverse mode and more preferably two wavelengths or more. As an upper limit, it is preferably 30 wavelengths or less, more preferably 20 wavelengths or less and further preferably 10 wavelengths or less. When the difference is larger than 30 wavelengths, electric resistance increases and the efficiency of generation of a resonant wave may fall, and from this standpoint, the shorter the difference, the more preferable.

In addition, a second means is a surface acoustic wave device including a pair of reflectors and an interdigital transducer arranged between the pair of reflectors, which has a cross electrode having a interdigitated portion and a dummy portion, and a dummy electrode, wherein the dummy electrode has a tail width different from a tail width of the dummy portion of the cross electrode adjacent to this dummy electrode.

By so doing, it is possible to cause the SAW in the transverse mode whose energy has exuded even to the dummy electrode and the dummy portion of the cross electrode to scatter due to non-uniformity of the dummy electrode or the dummy portion of the cross electrode and effectively suppress unwanted responses. Moreover, it is possible to realize low loss without substantially affecting the principal mode in which energy is concentrated on the interdigitated portion of the cross electrode or without any necessity for reducing or changing the length of the interdigitated portion.

Here, the "tail width" in the dummy electrode or interdigitated portion of the cross electrode is the length of the boundary between the cross electrode and the common electrode, and more specifically refers to the length of an imaginary straight line connecting corners produced in a connection between the cross electrode and the common electrode. Specific modes will be made clear in embodiments which will be described later.

Furthermore, according to this means, the tail width of the dummy electrode and the tail width of the dummy portion of the cross electrode are preferably weighted along the traveling direction of the surface acoustic wave and or preferably vary like a triangular, rectangular or trigonometric function or randomly.

Furthermore, a third means is a surface acoustic wave device including a pair of reflectors and an interdigital transducer arranged between this pair of reflectors, which has a cross electrode having a interdigitated portion and a dummy portion, and a dummy electrode, wherein the tail thickness of the dummy electrode is made to differ from the tail thickness of the dummy portion of the cross electrode adjacent to this dummy electrode.

Here, the "thickness" in the dummy electrode or dummy portion of the cross electrode refers to the thickness of the dummy electrode or dummy portion of the cross electrode when the surface acoustic wave device is cut by an imaginary straight line connecting corners produced in a connection between the cross electrode and the common electrode. Specific modes will be made clear in embodiments which will be described later.

According to this means, the tail thickness of the dummy electrode and the tail thickness of the dummy portion of the cross electrode are preferably weighted along the traveling direction of the surface acoustic wave or preferably vary like a triangular, rectangular or trigonometric function or randomly.

Furthermore, according to the first or third means, the tail width of the dummy electrode is preferably different from the tail width of the interdigitated portion in the cross electrode, the tail width of the dummy electrode and the tail width of the dummy portion of the cross electrode are preferably weighted along the traveling direction of the surface acoustic wave or preferably vary like a triangular, rectangular or trigonometric function or randomly.

Furthermore, according to the first means or a combination of the first means with the second means, the tail thickness of the dummy electrode is preferably different from the tail thickness of the interdigitated portion of the cross electrode, the tail thickness of the dummy electrode and the tail thickness of the dummy portion of the cross electrode are preferably weighted along the traveling direction of the surface acoustic wave or preferably vary like a triangular, rectangular or trigonometric function or randomly.

As described above, it is possible to efficiently suppress unwanted responses and provide a low-loss surface acoustic wave device.

BEST MODE FOR CARRYING OUT THE INVENTION

Hereinafter, the best modes for carrying out the invention will be explained with reference to the attached drawings.

Embodiment 1

Figure 1:
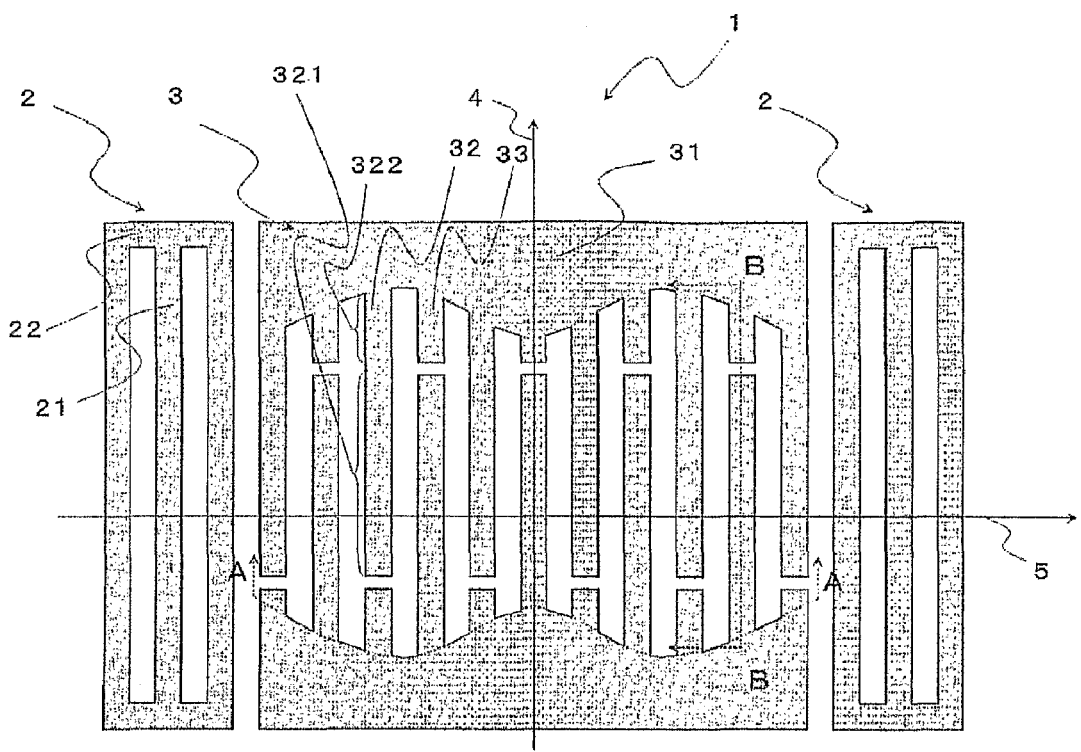
FIG. 1 is a schematic bird's eye view of a surface acoustic wave device according to Embodiment 1.

FIG. 1 shows a schematic view of a surface acoustic wave device according to this embodiment. An elastic resonant wave device 1 according to this embodiment is constructed of a pair of reflectors 2 formed opposed to each other on a substrate and an interdigital transducer (hereinafter simply referred to as "IDT") 3 arranged between this pair of reflectors 2, and the IDT 3 has a pair of common electrodes 31 and a plurality of cross electrodes 32 each having a interdigitated portion 321 and a dummy portion 322 and a plurality of dummy electrodes 33 are connected to each of the common electrodes 31. The plurality of cross electrodes connected to one of the common electrodes and a plurality of cross electrodes of the opposed common electrode cross each other and are arranged in a comb-like form.

The surface acoustic wave device according to this embodiment applies a voltage between the pair of common electrodes 31 of the IDT 3, causes the interdigitated portion 321 of the cross electrode 32 to produce an electric field and generate surface acoustic waves (hereinafter referred to as "SAW"), causes the pair of reflectors 2 to reflect these SAWs generated, and can thereby extract a wave of a specific frequency as a resonant wave. As for this resonant wave of the specific frequency, the SAW generated travels in a direction perpendicular (see reference numeral 5 in the figure) to the direction of the opposed sides (reference numeral 4 in the figure) of the pair of reflectors 2. Therefore, in the case of the surface acoustic wave device expressed as shown in FIG. 1, the direction of reference numeral 5 is defined as the "traveling direction of the resonant wave."

The substrate of the surface acoustic wave device is not particularly limited as far as it is possible to form the pair of reflectors 2 and the IDT 3 and cause them to function, but it is preferable to use a material having large piezoelectricity and high temperature stability, and a piezoelectric substrate such as an $LiNbO_3$ substrate and an LiTaO substrate can be used.

The pair of reflectors 2 and the IDT 3 are formed on the above described substrate and formed of a conductive metal. Various metals can be adopted as this conductive metal, and, for example, Al, Cu or an alloy thereof are preferably used. These electrodes can be created using a publicly known method of forming a metal thin film which becomes the material on the substrate and then using photo lithography and etching or the like.

The pair of reflectors 2 are formed so that two reflectors 2 are paired on the substrate. The configuration of each reflector 2 is as shown in FIG. 1 and includes a plurality of linear electrodes 21 (three electrodes in each reflector in FIG. 1) arranged in parallel and a reflector common electrode 22 commonly connecting the plurality of linear electrodes 21 and is formed in a rectangle shape. The plurality of these linear electrodes 21 are also arranged parallel to the plurality of linear electrodes 21 in the other reflector 2.

As described above, the IDT 3 is constructed of the pair of common electrodes 31, the plurality of cross electrodes 32 having the interdigitated portion 321 and dummy portion 322 formed in each common electrode 31 and the plurality of dummy electrodes 33, and the cross electrodes 32 and dummy electrodes are formed in the respective common electrodes alternately in the traveling direction of the resonant wave. Furthermore, the plurality of cross electrodes 32 are arranged in a comb-like form combined substantially in parallel with the plurality of cross electrodes 32 of the common electrode which is different from the common electrode to which the plurality of cross electrodes 32 are connected. In this case, from the necessity for the plurality of cross electrodes 32 and the plurality of linear electrodes 21 of the reflector 2 to resonate, these are also arranged substantially in parallel to each other.

Figure 2:
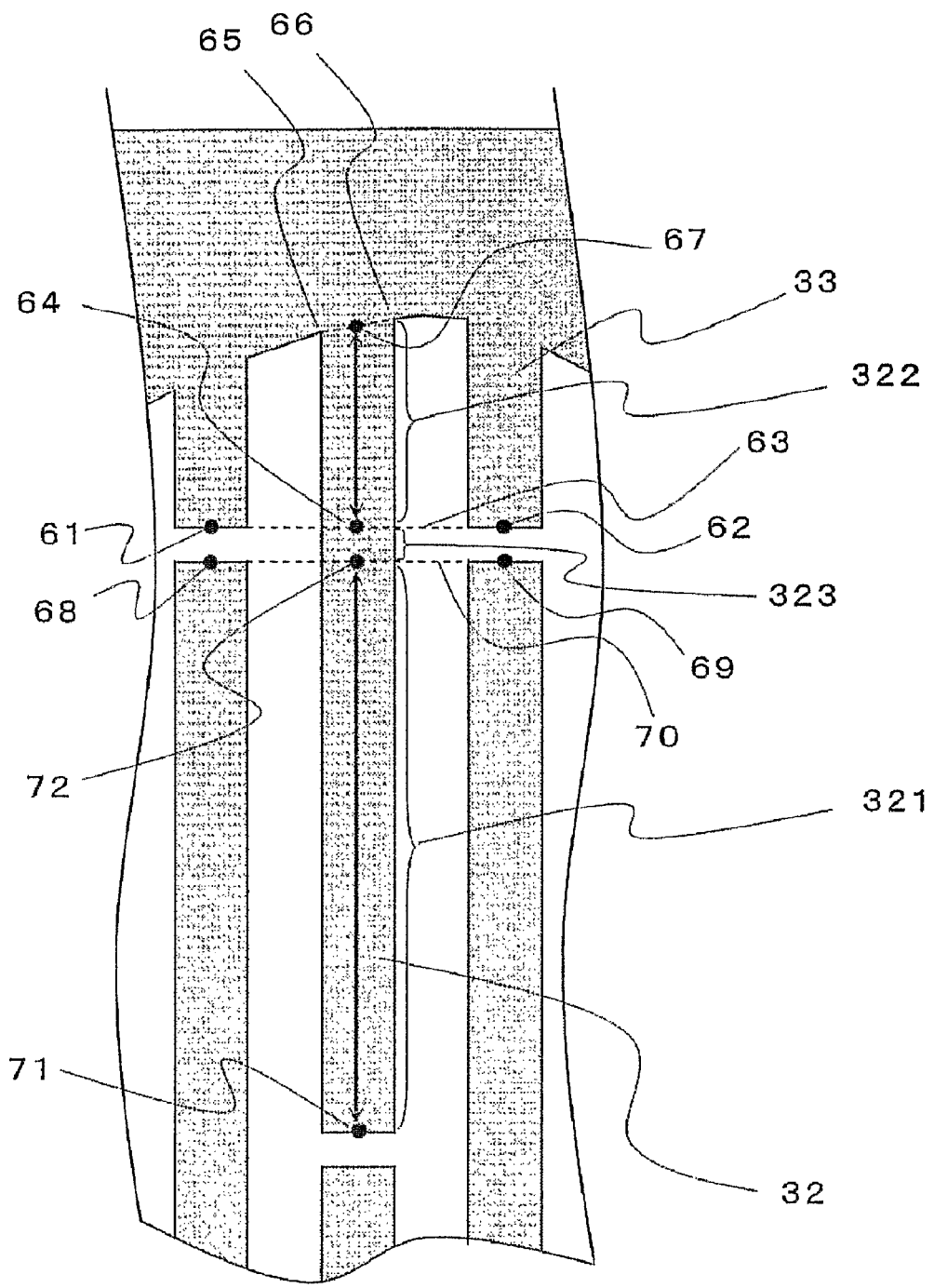
FIG. 2 illustrates a dummy portion and an interdigitated portion of a cross electrode.

The "dummy portion 322" of the cross electrode 32 refers to a portion which forms no crossing with the neighboring cross electrodes, or more specifically, to a portion of the cross electrode 32 on the common electrode side cut by an imaginary straight line 63 connecting vertices (see FIG. 2; indicated by reference numerals 61 and 62. When the electrode has a width, this indicates a midpoint in the width. The same will be applied hereinafter to a case where the vertices are referred to) of the two dummy electrodes 33 formed on both sides. Furthermore, the "length" of the dummy portion 322 refers to a length from the midpoint (reference numeral 64 in FIG. 2) of the width of the cross electrode which exists on the straight line connecting the vertices of the above described two dummy electrodes 22 to an end point of connection between the cross electrode and the common electrode. Here, the "end point of connection" refers to a midpoint (reference numeral 67 in FIG. 2) on the cross electrode which exists on an imaginary straight line connecting two corners (reference numerals 65 and 66 in FIG. 2) generated in the connection between the cross electrode and the common electrode. Furthermore, the "tail width" of the dummy portion used in other embodiments is defined to be the length of the straight line connecting the above described two corners (the same will be applied to the "tail width" of the dummy electrode 33).

Furthermore, the "interdigitated portion 321" of the cross electrode 32 refers to a portion which forms crossing with the cross electrodes arranged on both sides, and more specifically refers to a portion of the cross electrode cut by an imaginary straight line 70 connecting vertices (reference numerals 68 and 69 in FIG. 2) of the neighboring cross electrodes 32 on the opposite side of the portion connected to the common electrode. Furthermore, the "length" of the cross electrode section 321 of the cross electrode 32 refers to a distance between a vertex (reference numeral 71 in FIG. 2) of the cross electrode 32 and an imaginary midpoint (reference numeral 72 in FIG. 2) of the cross electrode on the imaginary straight line 70 connecting the vertices of the above described neighboring cross electrodes 32. The interdigitated portions 321 of the cross electrodes 32 are arranged crossing each other and this crossing allows surface acoustic waves in a principal mode to be generated in a concentrated manner. Furthermore, all the interdigitated portions 321 of the plurality of cross electrodes according to this embodiment have substantially the same length. Here, suppose "substantially the same" is a concept of falling within an allowable range of errors in manufacturing.

An area between the interdigitated portion 321 and the dummy portion 322 of the cross electrode 32 is a gap 323 and the "length" thereof is a distance between the imaginary point indicated by reference numeral 64 and the imaginary point indicated by reference numeral 72 in FIG. 2. The distance of this gap can take various values, but it is preferably within a range of $\lambda/2$ to $\lambda/4$ when considered from the standpoint of maintaining a reduction of loss of resonant waves.

Especially, a feature of this embodiment is that the lengths of the dummy electrode 33 and the dummy portion 322 of the cross electrode 32 are weighted. That is, the dummy electrode 33 has a length different from the length of the dummy portion 322 adjacent to this dummy electrode 33. For example in FIG. 1, the length of the dummy electrode 33 is different from the length of the dummy portion 322 of the adjacent cross electrode 32 and the length varies along the traveling direction of the resonant wave like a trigonometric function wave (sine wave or cosine wave).

In this way, by weighting the lengths of the dummy electrode 33 and the dummy portion 322 of the cross electrode 32, that is, changing their lengths, it is possible to cause energy to exude even to the dummy electrode 33 and the dummy portion of the cross electrode 32 and cause this dummy portion 322 or the dummy electrode 33 to scatter an SAW in a transverse mode and thereby effectively suppress unwanted responses. Moreover, the principal mode in which energy is concentrated on the interdigitated portion 321 of the cross electrode 32 is substantially not affected and there is no need to reduce or change the length of the interdigitated portion. As far as waves in a traverse mode can be scattered, the length may be changed in various modes such as a triangular, rectangular, trigonometric function or randomly.

The number of electrodes, width, thickness and distance between the electrodes or the like in the surface acoustic wave device according to this embodiment may be adjustable as appropriate according to the wavelength or the like of a resonant wave to be acquired. For example, since the distance between the interdigitated portions 321 of the neighboring cross electrodes may be $\lambda/2$ where the wavelength of the resonant wave is assumed to be $\lambda$, the width of the interdigitated portion 321 of the cross electrode can take various values smaller than $\lambda/2$. The same will also apply to the liner electrodes in the reflectors 2. There is no particular limitation to the length of the interdigitated portion 321 of the cross electrode 32 unless loss of SAW in a principal mode is increased, but it is preferably within a range of about $5\lambda$ to $100\lambda$ when the wavelength of the resonant wave is assumed to be $\lambda$ and more preferably within a range of $10\lambda$ to $50\lambda$. Moreover, the number of cross electrodes 32 can also be designed as appropriate, but it is preferably 10 to 1000 or more preferably on the order of 20 to 100.

Furthermore, various lengths can be designed for the length of the dummy portion 322 of the cross electrode 32, but if it is too long, an influence from electrode resistance may not be ignored and it is thereby preferably shorter, but too short a length may have an influence on the effect of SAW scattering in a traverse mode, which will be described later. Thus, it is preferably within a range greater than $1\lambda$ and smaller than 30 wavelengths or more preferably within a range of not less than $2\lambda$ and not more than $20\lambda$. This range is likewise applicable to the length of the dummy electrode.

EXAMPLE 1

In order to verify effects of the surface acoustic wave device according to this embodiment, an actual surface acoustic wave device was created. This will be explained more specifically below.

Figure 3:
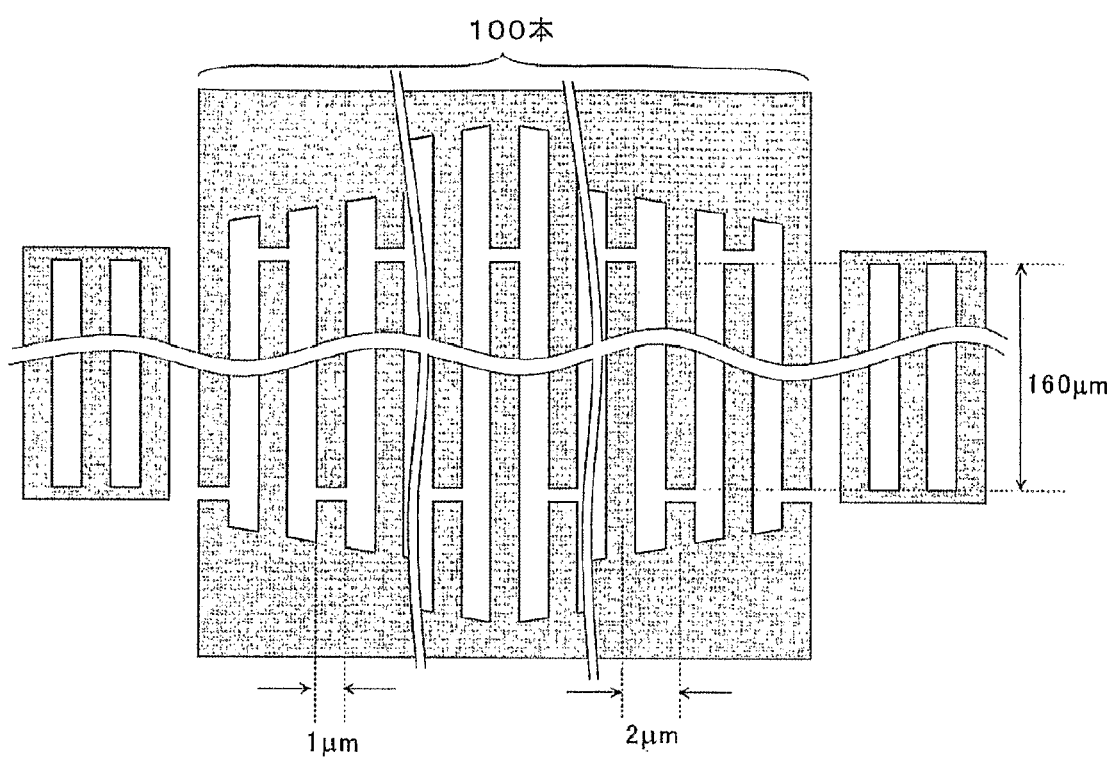
FIG. 3 is a schematic bird's eye view of the surface acoustic wave device according to Example 1.

In this example, two surface acoustic wave devices were created and connected, and characteristics thereof were measured. For one surface acoustic wave device 41, Y cut X propagation $LiNbO_3$ was used as the material of the substrate and Cu was used as the electrode material making up the reflector and IDT. Design was conducted in such a way that the number of linear electrodes of each reflector was 20, the length thereof was 160 µm, the electrode width was 1 µm, the distance between the electrodes was 2 µm, the number of cross electrodes of the IDT was 100, the electrode width was 1 µm, the distance between the electrodes was 2 µm, the length of the interdigitated portion of the cross electrode was 160 µm, the length of the dummy electrode was changed along the traveling direction of the resonant wave like a triangular wave, the length of the dummy electrode was longest $3\lambda$ in the center of the IDT and shortest $0.5\lambda$ at the end of the IDT. The wavelength of the resonant wave was designed to be 4 µm, and the thickness of the electrode was assumed to be approximately 0.3 µm (FIG. 3 shows a schematic view). The other surface acoustic wave device 42 was created to have substantially the same shape as that of the above described surface acoustic wave device, but only the distance between the electrodes was changed (value of $\lambda/2$).

Figure 4:
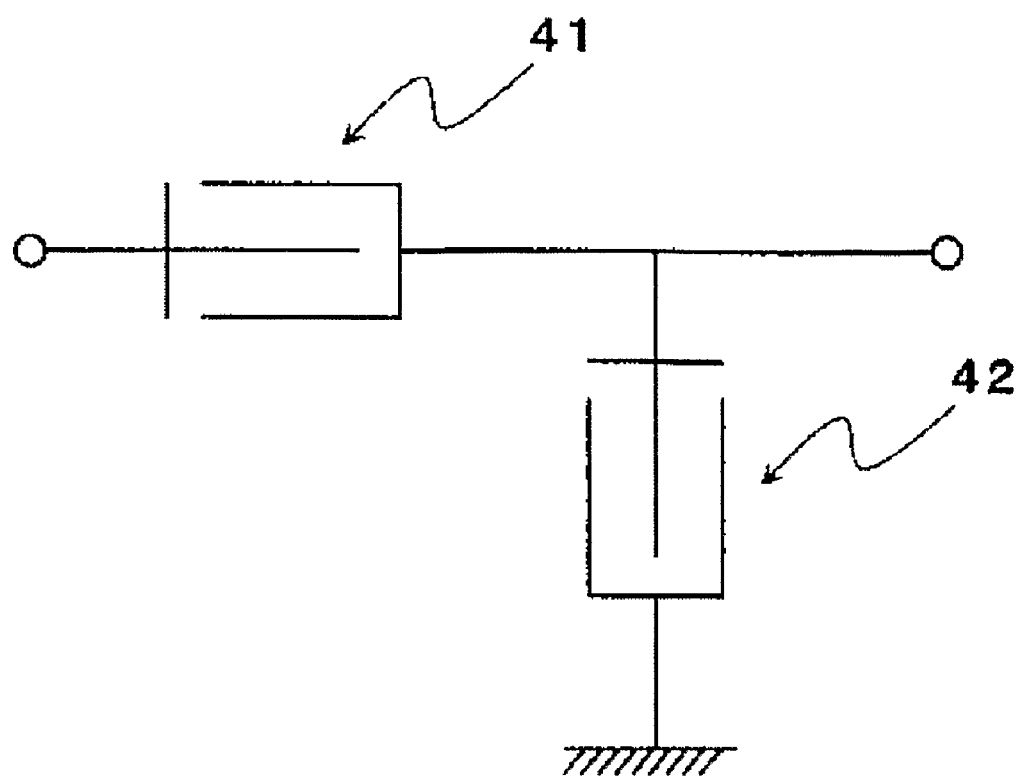
FIG. 4 illustrates a connection relationship of the surface acoustic wave device according to Example 1.

These devices were connected together as shown in FIG. 4, an AC voltage was applied to the common electrode and insertion loss was measured.

On the other hand, for a comparison of the results, a system was also created in which no weights were assigned to the dummy portions of the cross electrodes of the IDT in the surface acoustic wave device used in the example and an experiment was conducted (this surface acoustic wave device was designated as a comparative example). This surface acoustic wave device is one with no weights assigned to the lengths of the above described dummy electrodes and the interdigitated portions of the cross electrodes but fixed to $3\lambda$ respectively.

Figure 5:
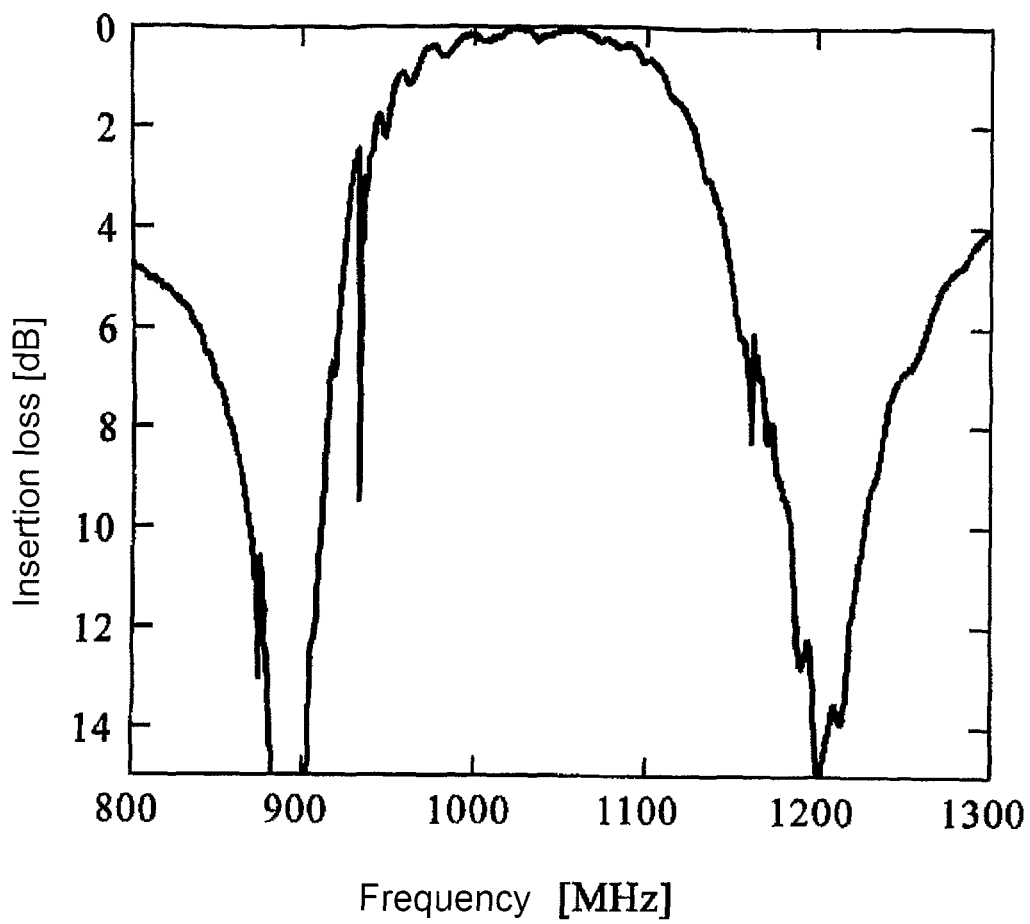
FIG. 5 illustrates an experiment result of the surface acoustic wave device according to Example 1.
Figure 6:
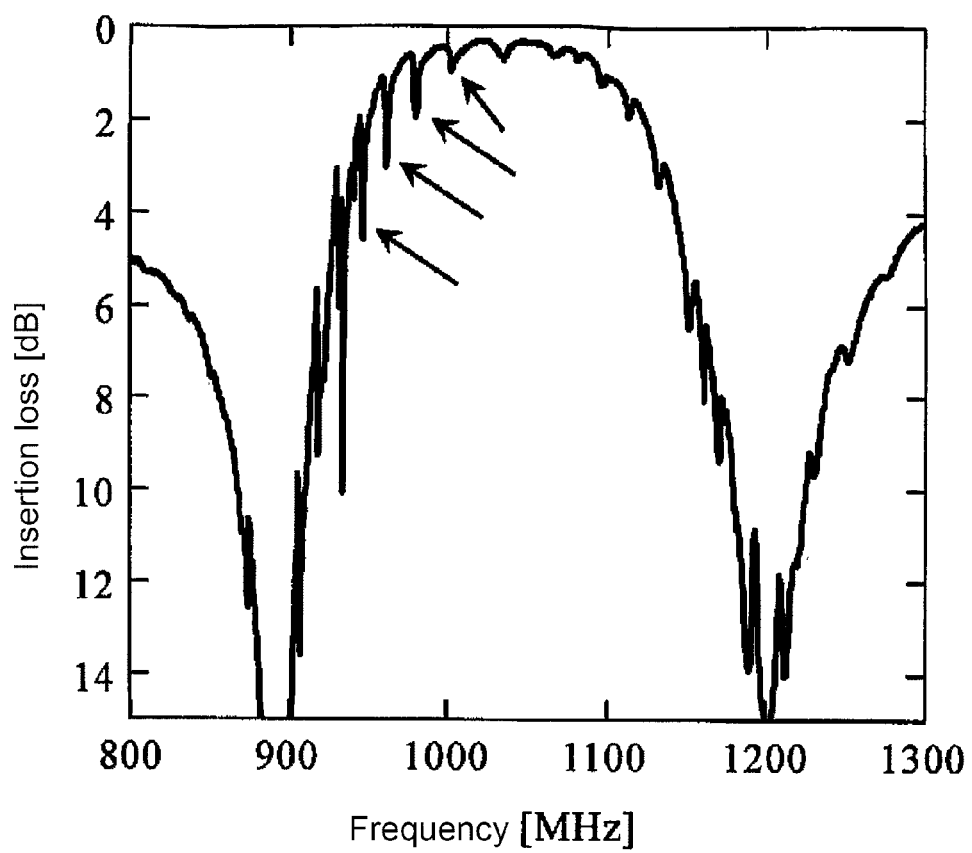
FIG. 6 illustrates an experiment result of a surface acoustic wave device according to a comparative example.

The results are shown in FIG. 5 and FIG. 6. FIG. 5 shows the effect of this example and FIG. 6 shows the effect of the comparative example. According to these results, it is understandable that the frequency characteristic shown in FIG. 5 suppresses losses (see arrows in FIG. 6) due to the surface acoustic wave in the transverse mode more significantly and produces fewer losses in the principal mode than the frequency characteristic shown in FIG. 6. In this way, the effects of the surface acoustic wave device according to this embodiment could be verified.

Embodiment 2

Figure 7:
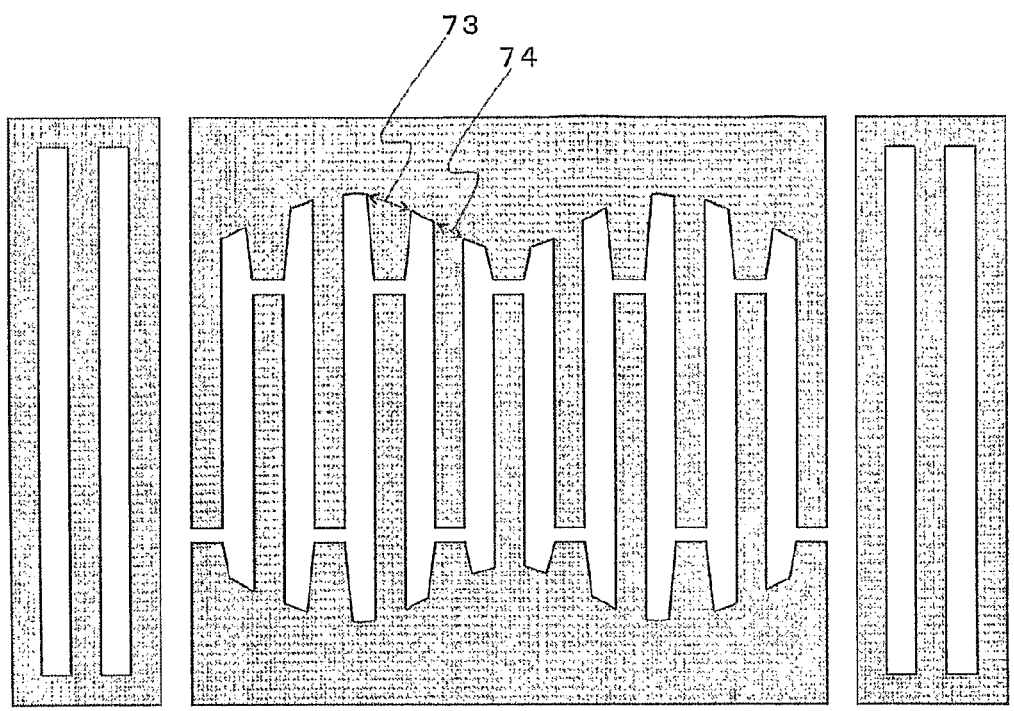
FIG. 7 is a schematic bird's eye view of a surface acoustic wave device according to Embodiment 2.

A surface acoustic wave device according to this embodiment is different from the surface acoustic wave device according to Embodiment 1 in that weights are further assigned to the tail width of the dummy electrode and the tail width of the dummy portion of the cross electrode. Other parts are substantially the same as the surface acoustic wave device according to Embodiment 1. FIG. 7 shows a schematic view of the surface acoustic wave device according to this embodiment.

Explaining more specifically, the surface acoustic wave device of this embodiment has been configured so that a tail width 73 of a dummy electrode is changed and the tail width 73 of the dummy electrode differs from a tail width 74 of a dummy portion of a cross electrode. Adopting such a configuration allows an SAW in a transverse mode to scatter. Of course, the effect of effectively concentrating the surface acoustic wave in the principal mode can also be expected. Furthermore, as for a mode of variation of the tail width, the tail width can be changed along the traveling direction of the resonant wave like a triangular, rectangular, trigonometric function or randomly.

Figure 8:
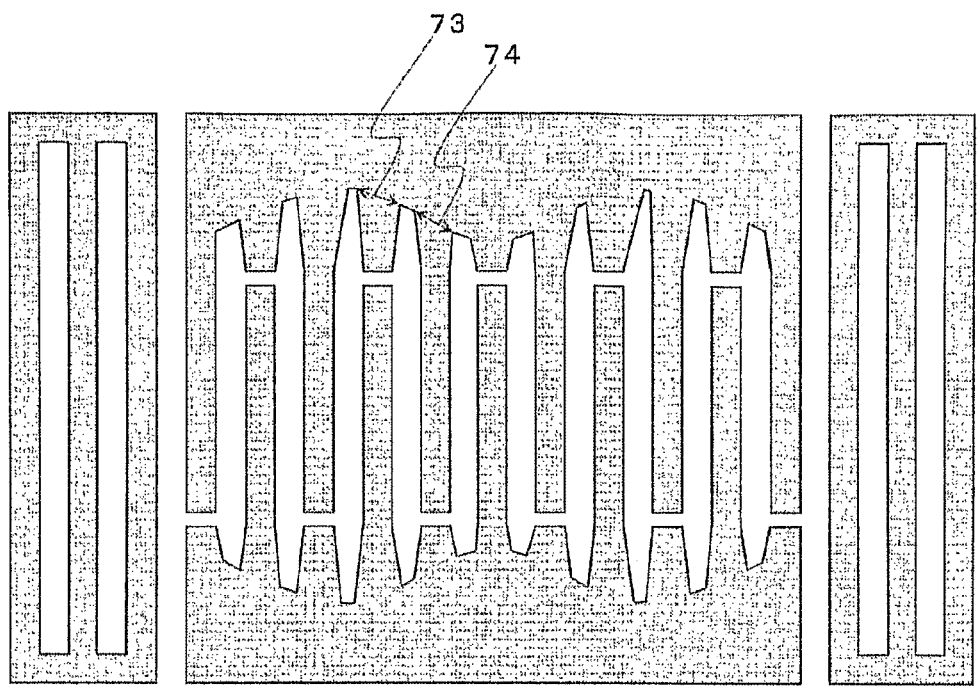
FIG. 8 is a schematic bird's eye view of a modified mode of the surface acoustic wave device according to Embodiment 2.
Figure 9:
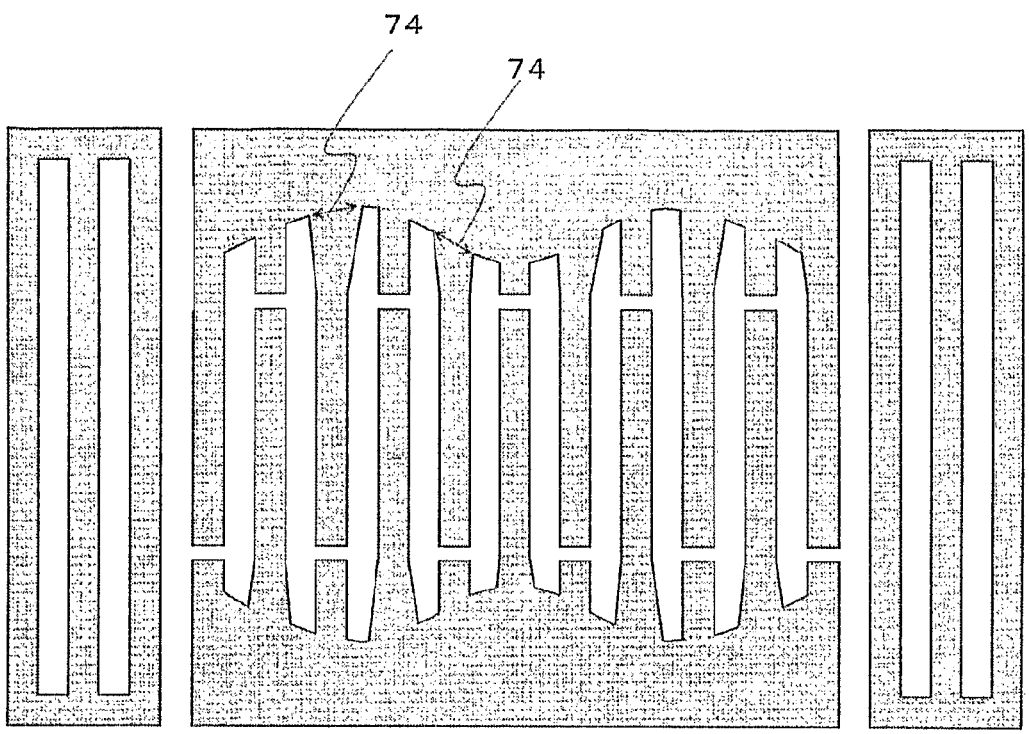
FIG. 9 is a schematic bird's eye view of a modified mode of the surface acoustic wave device according to Embodiment 2.
Figure 10:
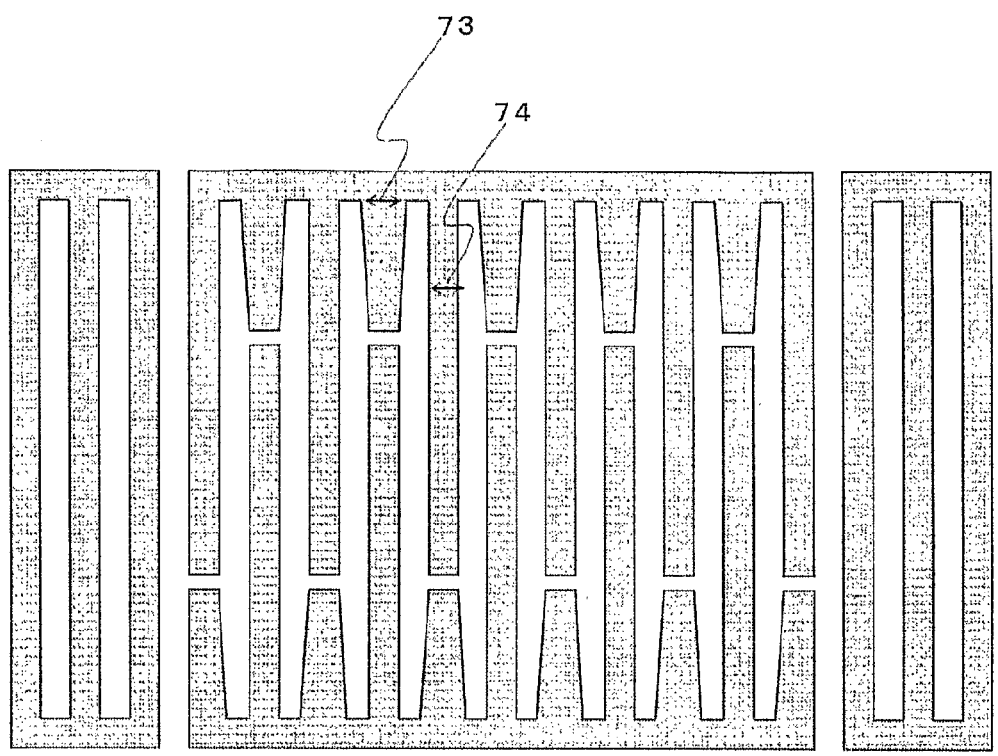
FIG. 10 is a schematic bird's eye view of a modified mode of the surface acoustic wave device according to Embodiment 2.

This embodiment has changed the tail width 73 of the dummy electrode, causing the tail width of the dummy portion of the cross electrode to differ from the tail width 73 of the dummy electrode, but it is also possible to consider a mode in which the tail width of the dummy electrode and the tail width of the dummy portion of the cross electrode are likewise changed so as to cause the one to differ from the other (see FIG. 8) and a mode in which only the width of the dummy portion of the cross electrode is changed so as to cause the one to differ from the other (see FIG. 9) as modes whereby similar effects can be expected. Furthermore, even when only the widths are independently changed without assigning weights to the lengths, no effect of scattering by lengths is obtained but it is possible to obtain an effect of scattering caused by non-uniformity in tail widths, and this can be thereby considered as an embodiment (see FIG. 10. In FIG. 10, only the tail width of the dummy electrode is changed, but the tail width of the dummy portion of the cross electrode may also be changed in the same way as that described above).

Embodiment 3

Figure 11:
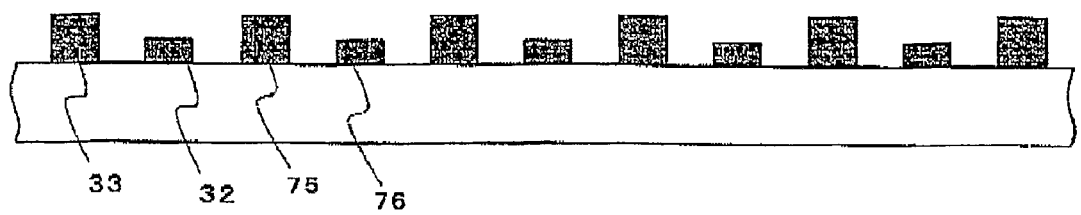
FIG. 11 shows a cross section of a surface acoustic wave device according to Embodiment 3.

A surface acoustic wave device according to this embodiment differs from the surface acoustic wave device according to Embodiment 1 in that weights are also assigned to the thickness of a connected part (tail) between a dummy electrode and a common electrode. Other parts are substantially the same as those of the surface acoustic wave device according to Embodiment 1. That is, when seen from the front, the surface acoustic wave device is substantially the same as that in FIG. 1, but the configuration in sections is different. FIG. 11 shows a schematic cross-sectional view when the surface acoustic wave device according to this embodiment is cut along a line A-A in FIG. 1.

More specifically, the surface acoustic wave device according to this embodiment is different in that a thickness 75 of a connected part (tail) between a dummy electrode 33 and a common electrode is made to be greater than a thickness 76 of a dummy portion of a cross electrode. This produces non-uniformity in the vicinity of the connected part with the common electrode, allows an SAW in a transverse mode to scatter, can effectively suppress unwanted responses and provide a low-loss surface acoustic wave device.

This embodiment has adopted a mode in which the thickness of the dummy electrode is made to vary to provide differences, but it is also possible to consider a mode in which both the thickness of the dummy portion of the cross electrode and the thickness of the dummy portion of the cross electrode are changed to provide differences and a mode in which only the thickness of the dummy portion of the cross electrode is changed to cause the thickness to vary as modes whereby similar effects can be expected. Furthermore, as a mode of changing the thickness, it is also useful to change the thickness along the traveling direction of the resonant wave like a triangular, rectangular, trigonometric function or randomly.

Figure 12:
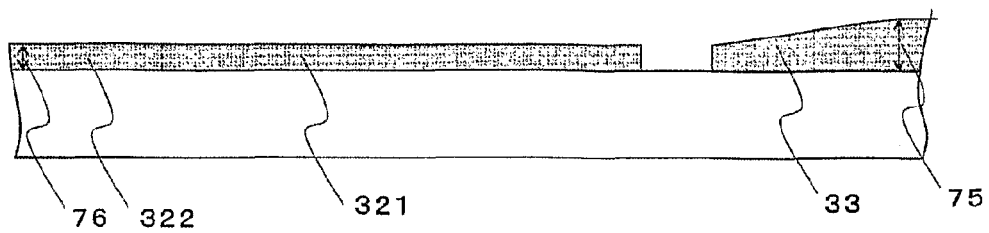
FIG. 12 shows a cross section of the surface acoustic wave device according to Embodiment 3.

When changing these thicknesses, it is desirable that the interdigitated portion and the gap part have uniform thicknesses in the vicinity of the interdigitated portion of the cross electrode to suppress losses of SAW in the principal mode, and therefore it is also desirable that the thickness in sections be made to vary as the distance from the tail of the dummy electrode or the tail of the dummy portion of the cross electrode becomes shorter (see FIG. 12. FIG. 12 shows a mode in which the thickness of the dummy electrode of the cross electrode in this embodiment increases as the distance from the tail of the dummy electrode of the cross electrode in this embodiment becomes shorter).

Furthermore, as in the case of above described Embodiment 2, even when weights are not assigned to the lengths of the dummy electrode or the dummy portion of the cross electrode, it is also possible to achieve non-uniformity through weighting of only thickness, cause an SAW in the transverse mode to efficiently scatter and realize a low-loss surface acoustic wave device.

Embodiment 4

Figure 13:
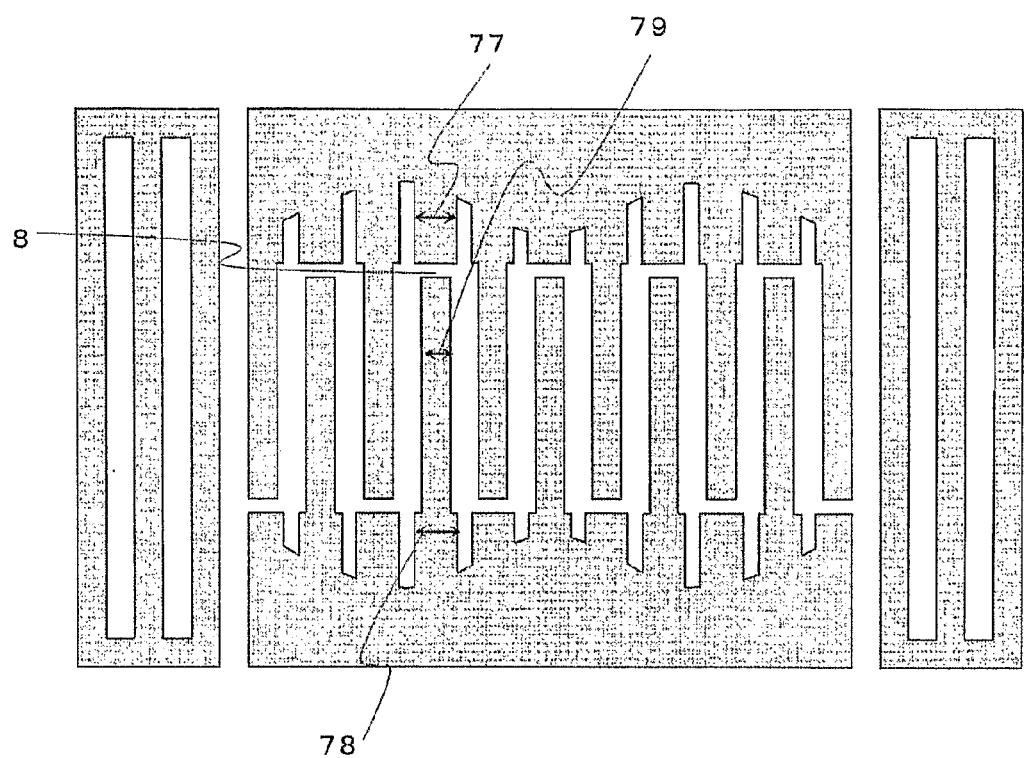
FIG. 13 is a schematic bird's eye view of a surface acoustic wave device according to Embodiment 4.

This embodiment is substantially the same as Embodiment 1 and has features that a width 77 of a dummy electrode at its vertex (which refers to the part opposite to the tail) is made to differ from a width 79 of a cross electrode at its vertex arranged with a gap from this dummy electrode and further a width 78 of the dummy portion in the vicinity of a boundary between the dummy portion of the cross electrode and the gap 8 is made to differ from a width 79 in the vicinity of a boundary between the interdigitated portion of the cross electrode and the gap 8. That is, this embodiment has features that the width of the dummy electrode is made to differ from the width of the cross electrode, both electrodes being opposed to each other across the gap 8 and further the width of the interdigitated portion of the cross electrode is made to differ from the width of the dummy portion. FIG. 13 shows a schematic bird's eye view of this.

By so doing in this embodiment, it is possible to maintain periodicity and regularity of both electrodes sandwiching the gap 8, prevent losses of an SAW in a principal mode, cause an SAW in a transverse mode in which energy is concentrated on the interdigitated portion of the cross electrode to combine with other SAWs in a transverse mode, cause the combined SAW to exude to the dummy portion of the cross electrode and the dummy portion and scatter here, suppress unwanted responses and thereby provide a low-loss surface acoustic wave device.

Figure 14:
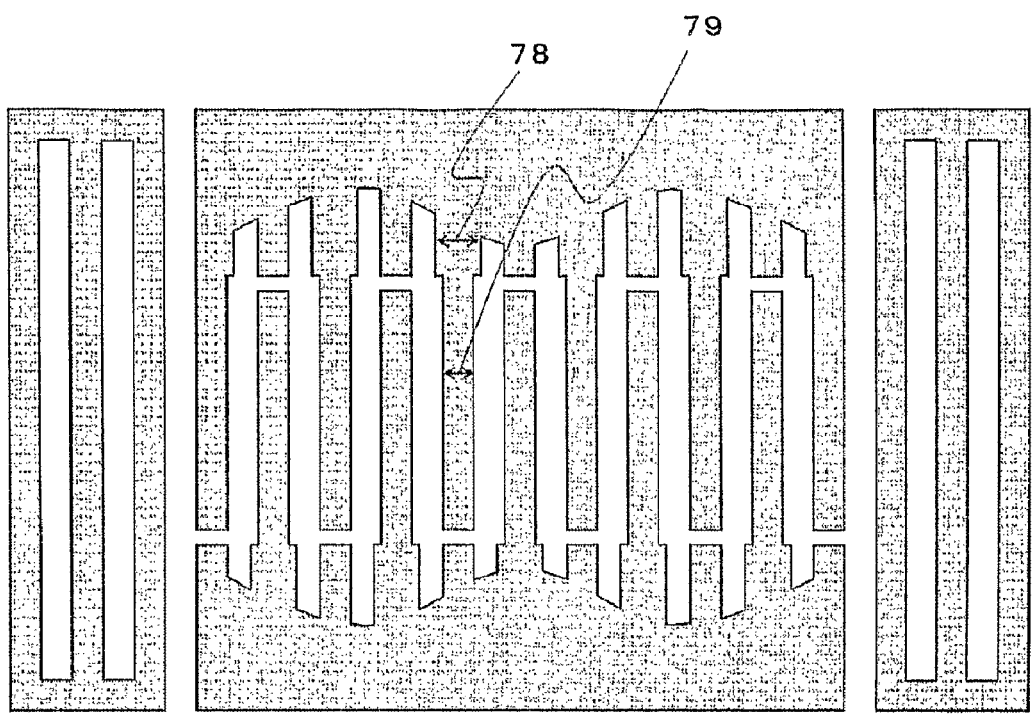
FIG. 14 is a schematic bird's eye view of a modified embodiment of the surface acoustic wave device according to Embodiment 4.

This embodiment causes both the width 77 of the dummy electrode at its vertex and the width of the dummy portion of the cross electrode to differ, but, as far as periodicity and regularity of the boundary between both electrodes in the gap can be kept, it is also possible to adopt a mode in which only the width of the dummy electrode at its vertex or only the width 78 of the dummy portion in the vicinity of the boundary between the dummy portion of the cross electrode and the gap 8 or only the width 79 in the vicinity of the boundary between the interdigitated portion of the cross electrode and the gap 8 is made to change (see FIG. 14). Furthermore, this method of changing widths is adjustable as appropriate according to the substrate material and the resonant wavelength to be extracted, but the change in widths is generally preferable to be on the order of 1.2 times to 2 times.

Furthermore, this embodiment causes the widths to differ, but it is also possible to obtain effects similar to those in the above described case of changing widths by causing the thicknesses of the dummy electrode and the cross electrode opposed to each other across a gap to differ.

Furthermore, any one of the above described first to third embodiments may also be combined with each other and it is thereby possible to efficiently suppress unwanted responses and provide a low-loss elastic resonant wave device.

EXAMPLE 2

In this example, the surface acoustic wave device according to Embodiment 4 was actually created and effects thereof were verified.

The material and the number of electrodes, width, thickness and distance between electrodes of cross electrodes or the like of the surface acoustic wave device according to this example are substantially the same as those of the surface acoustic wave device in Example 1, but the width of the dummy electrode at its vertex was made to differ from the width of the interdigitated portion of the cross electrode and further the width in the vicinity of the boundary between the dummy portion and the gap of the cross electrode was made to differ from the width of the interdigitated portion of the cross electrode (the width of the electrode thereof was set to 1.5 μm). FIG. 13 shows a schematic bird's eye view. Furthermore, in this example, an AC voltage was applied to the pair of common electrodes and in this way conductance thereof was measured and effects thereof were verified.

Figure 15:
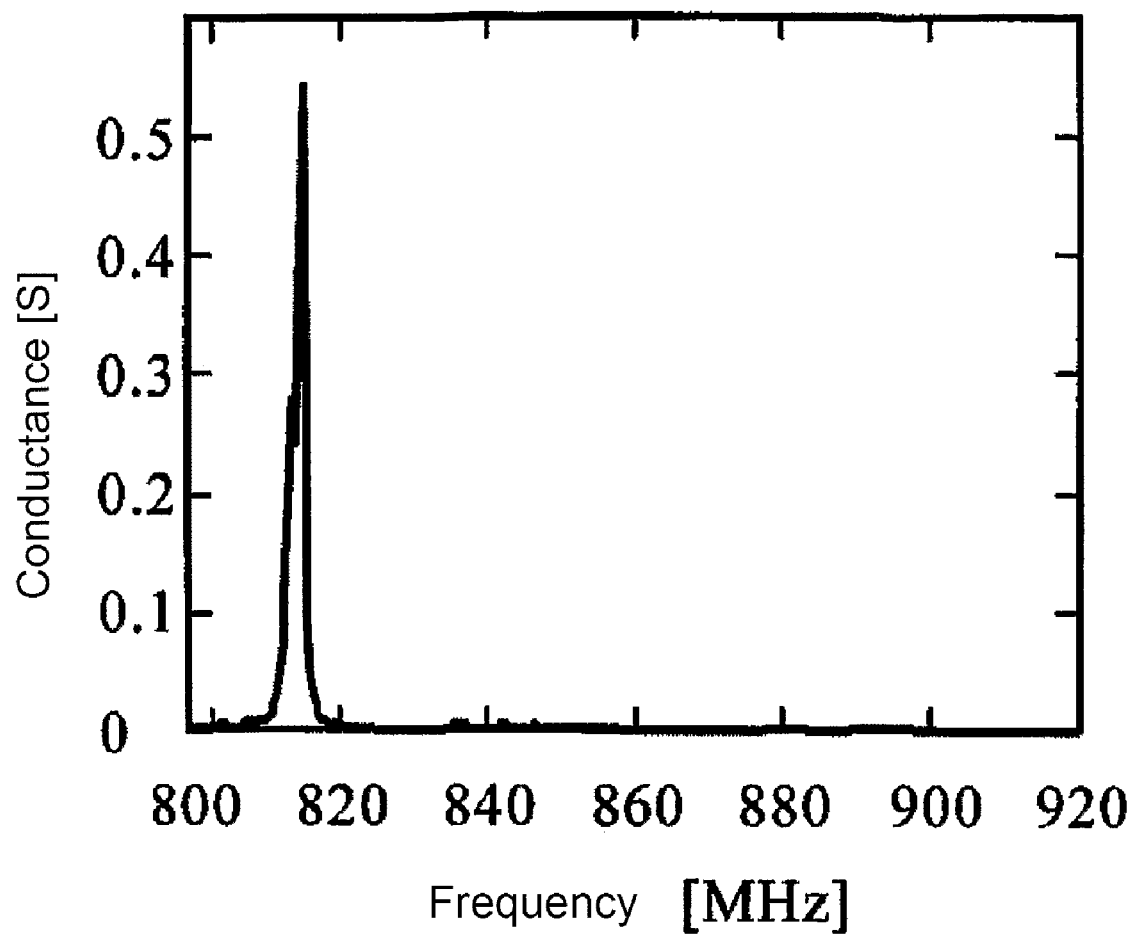
FIG. 15 shows an experiment result of the surface acoustic wave device according to Example 2.
Figure 16:
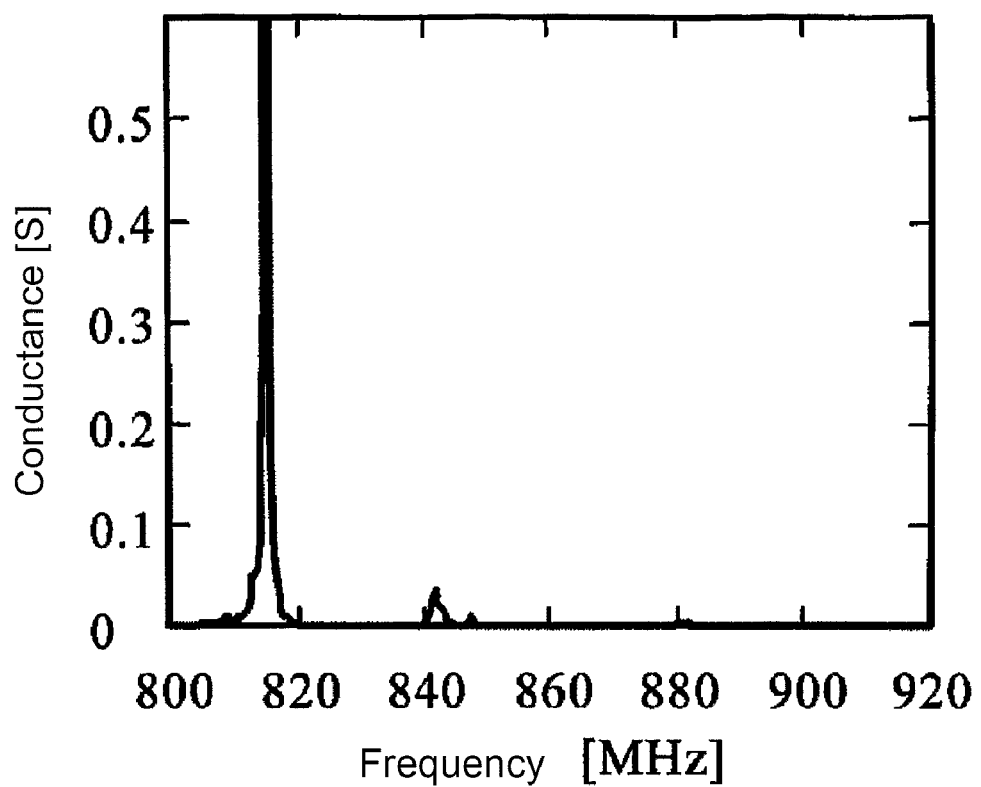
FIG. 16 shows an experiment result of the surface acoustic wave device according to the comparative example.
Figure 17:
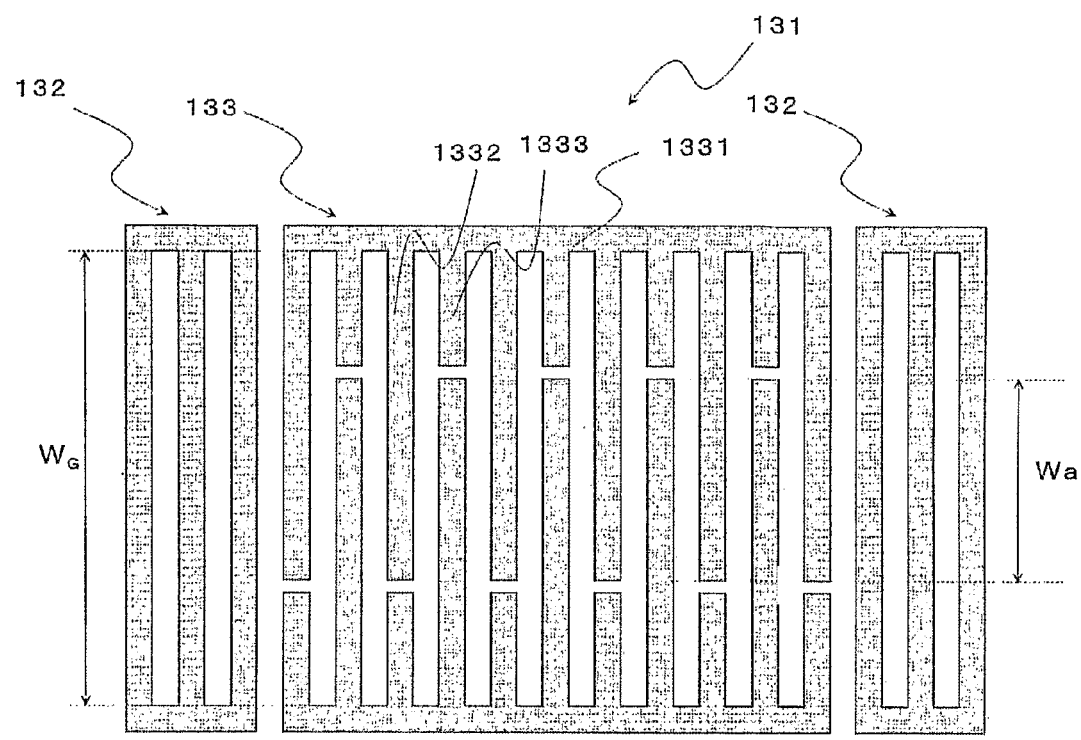
FIG. 17 is a schematic bird's eye view of a surface acoustic wave device according to a first conventional technique.
Figure 18:
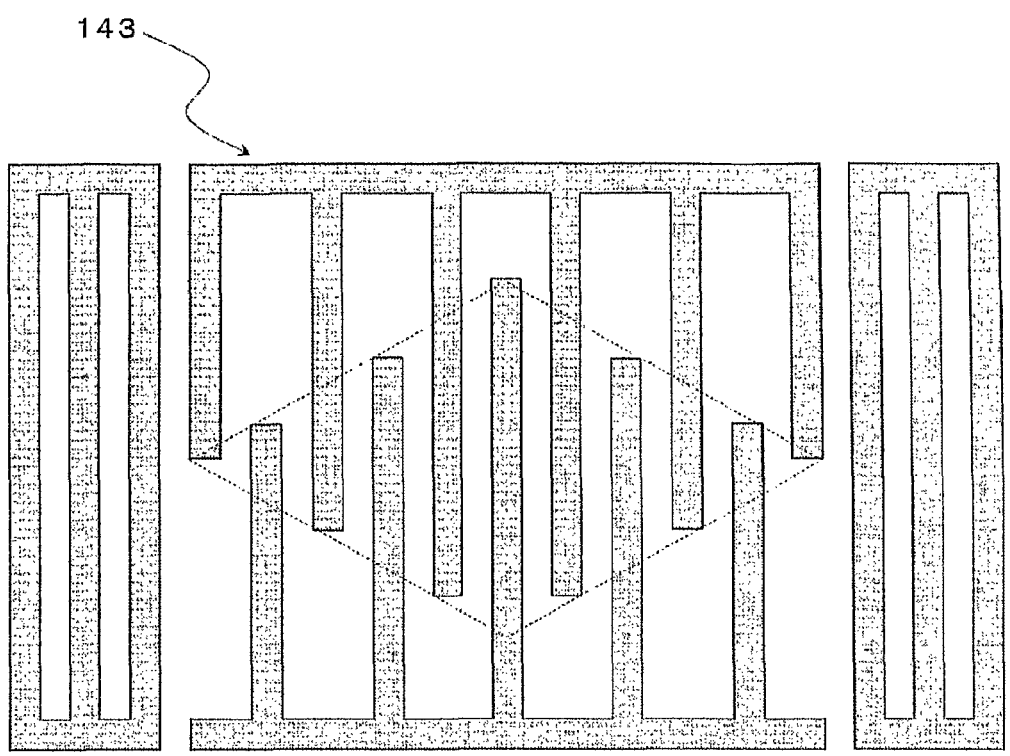
FIG. 18 is a schematic bird's eye view of a surface acoustic wave device according to a second conventional technique.

The results are shown in FIG. 15 and FIG. 16. FIG. 15 shows the result indicating the frequency characteristic of the surface acoustic wave device in this example and FIG. 16 shows the result of the semiconductor device according to Example 1 prepared in the same way as shown in FIG. 15. In FIG. 16, though there is an unwanted response in the vicinity of 840 MHz which is seemingly attributable to a transverse mode, no such unwanted response was observed in FIG. 15. That is, this embodiment can reduce unwanted responses more effectively. Furthermore, it was possible to verify that loss of the surface acoustic wave in the principal mode was also suppressed effectively.

FIG. 3
1 100 ELECTRODES

FIG. 5
1 INSERTION LOSS [dB]
2 FREQUENCY [MHz]

FIG. 6
1 INSERTION LOSS [dB]
2 FREQUENCY [MHz]

FIG. 15
1 CONDUCTANCE [S]
2 FREQUENCY [MHz]

FIG. 16
1 CONDUCTANCE [S]
2 FREQUENCY [MHz]

The invention claimed is:

1. A surface acoustic wave device comprising:
a pair of reflectors; and
an interdigital transducer arranged between the pair of reflectors,
the interdigital transducer comprising a plurality of cross electrodes, a plurality of dummy electrodes, and a conductive plate, the cross electrodes and the dummy electrodes extending substantially parallel to one another and alternating with one another, the conductive plate including a non-linear edge,
wherein each of the cross electrodes and the dummy electrodes extends in a substantially elongated shape from the non-linear edge of the conductive plate,
wherein each of the cross electrodes is longer than each of the dummy electrodes,
wherein each of the cross electrodes includes a first end facing away from the non-linear edge of the conductive plate, the first ends of the cross electrodes being substantially aligned with one another,
wherein each of the dummy electrodes includes a second end facing away from the non-linear edge of the conductive plate, the second ends of the dummy electrodes being substantially aligned with one another, and,
wherein each of the cross electrodes and the dummy electrodes includes a tail contacting the edge of the conductive plate, and wherein the tail width of the dummy electrode is different from the width of at least a portion of the cross electrode.

2. The surface acoustic wave device according to claim 1, wherein the tail width of the dummy electrode and the tail width of the cross electrode are weighted along the traveling direction of a surface acoustic wave.

3. The surface acoustic wave device according to claim 1, wherein the tail width of the dummy electrode and the tail width of the the cross electrode vary along the traveling direction of a surface acoustic wave comprising a triangular, rectangular or trigonometric wave.

4. A surface acoustic wave device comprising:
a pair of reflectors; and
an interdigital transducer arranged between the pair of reflectors,
the interdigital transducer comprising a plurality of cross electrodes, a plurality of dummy electrodes, and a conductive plate, the cross electrodes and the dummy electrodes extending substantially parallel to one another and alternating with one another, the conductive plate including an edge,
wherein each of the cross electrodes and the dummy electrodes extends in a substantially elongated shape from the edge of the conductive plate,
wherein each of the cross electrodes is longer than each of the dummy electrodes,
wherein each of the cross electrodes and the dummy electrodes includes a tail contacting the edge of the conductive plate,
wherein the width of the tail of one of the dummy electrodes is different from the width of the tail of a cross electrode neighboring the one dummy electrode, and
wherein the tail width of the dummy electrode and the tail width of the cross electrode are weighted along a traveling direction of a surface acoustic wave.

5. A surface acoustic wave device comprising:
a pair of reflectors; and
an interdigital transducer arranged between the pair of reflectors,
the interdigital transducer comprising a plurality of cross electrodes, a plurality of dummy electrodes, and a conductive plate, the cross electrodes and the dummy electrodes extending substantially parallel to one another and alternating with one another, the conductive plate including an edge,
wherein each of the cross electrodes and the dummy electrodes extends in a substantially elongated shape from the edge of the conductive plate,
wherein each of the cross electrodes is longer than each of the dummy electrodes,
wherein each of the cross electrodes and the dummy electrodes includes a tail contacting the edge of the conductive plate,
wherein the width of the tail of one of the dummy electrodes is different from the width of the tail of a cross electrode neighboring the one dummy electrode, and
wherein the tail width of the dummy electrode and the tail width of the cross electrode vary along the traveling direction of the surface acoustic wave comprising a triangular, rectangular or trigonometric wave.

6. A surface acoustic wave device comprising:
a pair of reflectors; and
an interdigital transducer arranged between the pair of reflectors,
the interdigital transducer comprising a plurality of cross electrodes, a plurality of dummy electrodes, and a conductive plate, the cross electrodes and the dummy electrodes extending substantially parallel to one another and alternating with one another, the conductive plate including an edge,
wherein each of the cross electrodes and the dummy electrodes extends from the edge of the conductive plate, and is in a form of substantially elongated strip having a thickness,
wherein each of the cross electrodes is longer than each of the dummy electrodes,
wherein each of the cross electrodes and the dummy electrodes includes a tail contacting the edge of the conductive plate, and
wherein a thickness of the tail of one of the dummy electrodes is different from a thickness of the tail of a cross electrode neighboring the one dummy electrode.

7. The surface acoustic wave device according to claim 6, wherein the tail thickness of the dummy electrode and the tail thickness of the cross electrode are weighted along a traveling direction of a surface acoustic wave.

8. The surface acoustic wave device according to claim 6, wherein the tail thickness of the dummy electrode and the tail thickness of the cross electrode vary along a traveling direction of a surface acoustic wave comprising a triangular, rectangular or trigonometric wave.

9. The surface acoustic wave device according to claim 6, wherein each of the cross electrodes and the dummy electrodes includes a tail contacting the edge of the conductive plate, and wherein a tail width of the dummy electrode is different from a width of at least a portion of the cross electrode.

10. The surface acoustic wave device according to claim 9, wherein the tail width of the dummy electrode and the tail width of the cross electrode are weighted along the traveling direction of a surface acoustic wave.

11. The surface acoustic wave device according to claim 9, wherein the tail width of the dummy electrode and the tail width of the cross electrode vary along the traveling direction of a surface acoustic wave comprising a triangular, rectangular or trigonometric wave.

12. A surface acoustic wave device comprising:
a pair of reflectors; and
an interdigital transducer arranged between the pair of reflectors,
the interdigital transducer comprising a plurality of cross electrodes, a plurality of dummy electrodes, and a conductive plate, the cross electrodes and the dummy electrodes extending substantially parallel to one another and alternating with one another, the conductive plate including a non-linear edge,
wherein each of the cross electrodes and the dummy electrodes extends in a substantially elongated shape from the non-linear edge of the conductive plate,
wherein each of the cross electrodes is longer than each of the dummy electrodes,
wherein each of the cross electrodes includes a first end facing away from the non-linear edge of the conductive plate, the first ends of the cross electrodes being substantially aligned with one another,
wherein each of the dummy electrodes includes a second end facing away from the non-linear edge of the conductive plate, the second ends of the dummy electrodes being substantially aligned with one another, and
wherein each of the cross electrodes and the dummy electrodes includes a tail contacting the edge of the conductive plate, and wherein a tail thickness of the dummy electrode is different from a thickness of at least a portion of the cross electrode.

13. The surface acoustic wave device according to claim 12, wherein the tail thickness of the dummy electrode and a tail thickness of the cross electrode are weighted along the traveling direction of a surface acoustic wave.

14. The surface acoustic wave device according to claim 12, wherein the tail thickness of the dummy electrode and a tail thickness of the cross electrode vary along the traveling direction of a surface acoustic wave comprising a triangular, rectangular or trigonometric wave.

* * * * *